INVENTOR:
KAROLY G. FISTER,
BY Julius J. Zaskalicky
HIS ATTORNEY.

3,295,029

FIELD EFFECT SEMICONDUCTOR DEVICE WITH POLAR POLYMER COVERED OXIDE COATING

Karoly Gyorgy Fister, Syracuse, N.Y., assignor to General Electric Company, a corporation of New York Filed Apr. 3, 1963, Ser. No. 270,294
4 Claims. (Cl. 317—235)

The present invention relates to semiconductor devices and methods of making such devices, and in particular relates to improved field effect transistors and methods of making same.

While field effect transistors have been known in the art for some time, only recently has considerable commercial interest been evidenced in such devices. One form of such device consists of a bar of semiconductor material of one conductivity type, to the ends of which are made electrical connections and intermediate the ends of which a region of opposite conductivity is provided. In operation, a unidirectional potential is provided between the ends of the bar in series with a load. The intermediate region of opposite conductivity type is reversely biased with respect to one of the electrical contacts. As the potential of that region is varied the depletion layer of the P-N junction varies in width thereby causing a variation in the resistance of the bar. Thus current flow in the load responds to the potential applied to the intermediate region.

Field effect transistors are voltage responsive devices and have high input impedances, analogous to a vacuum tube, and in contrast to conventional transistors which are current-responsive devices and have low input impedances. Accordingly, field effect transistors are suitable for use in special applications in which high input impedances are necessary. Also the high input and output impedances of field effect transistors permits isolation between the input and output thereof, not available in conventional transistors. Field effect transistors are complementary to, or the dual of, the conventional transistors, thus these devices lend themselves to cascading circuit arrangements. Field effect transistors normally are capable of providing considerably higher amplification than is capable of being obtained with conventional transistors. In certain circuit arrangements the field effect transistor can take the place of a plurality of conventional transistors.

Field effect transistors commercially available have taken a number of forms and have been made by various technologies, useful in making conventional transistors as well. Such prior art devices have been involved in construction, costly, and deficient in performance and stability.

The present invention is directed to providing an improved field effect transistor device and method of making same overcoming such shortcomings of prior art devices.

Accordingly an object of the present invention is to provide an improved field effect transistor device and method of making same.

Another object of the present invention is to provide a field effect transistor of good performance capability.

Another object of the present invention is to provide a field effect transistor having a very high degree of stability over a long period of time.

Another object of the present invention is to provide a field effect transistor of simple construction and low cost.

In carrying out the invention in one illustrative form there is provided a bar of silicon semiconductor material including a pair of end regions of N-type conductivity and a thin region of P-type conductivity spaced between the end regions forming therewith a pair of P-N junctions. Electrical connections are made to each of the regions. A silicon oxide layer is provided covering the entire body where exposed and the oxide layer in turn is covered by a dielectric such as a positive polar polymer formed by reacting the surface of the oxide layer with a hydrolizable organo-amino alkoxy silane.

The features of the present invention which are believed to be novel are set forth with particularity in the appended claims. The invention itself, however, both as to its organization and method of operation, together with further objects and advantages thereof may best be understood by reference to the following description taken in connection with the following drawings in which:

Figure 1:
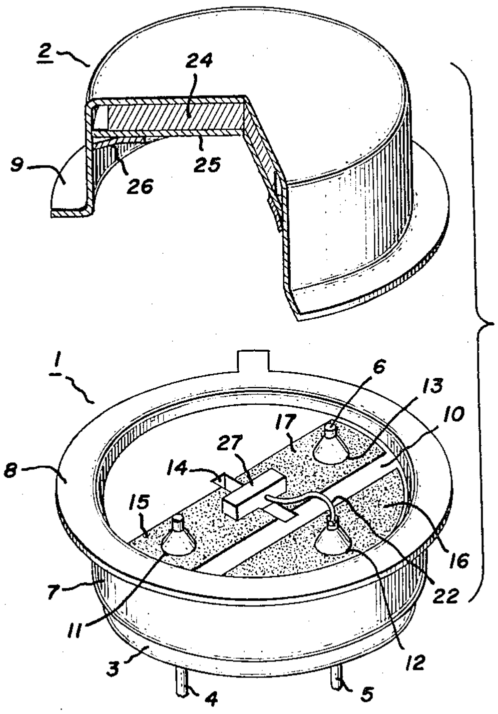
FIGURE 1 is a perspective view of a semiconductor device shown disassembled into two parts, one of which is partially sectioned showing the internal construction of the device in accordance with the present invention.
Figure 2:
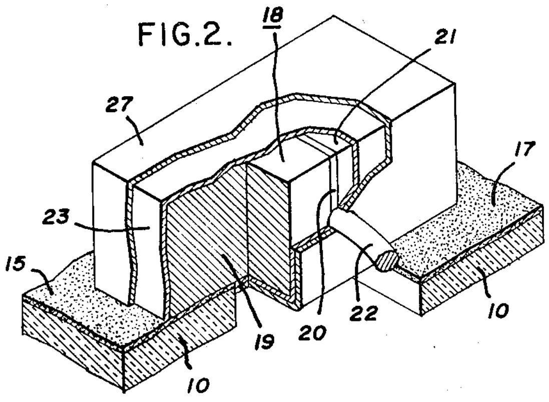
FIGURE 2 is an enlarged perspective view of a construction of the active elements of the semiconductor device of FIGURE 1.

Referring now to FIGURES 1 and 2 there is show an exemplary device in accordance with the present invention comprising a header assembly 1 and a cap member 2 which upon completion of the fabrication of the header may be assembled by welding or soldering of the mating flange portions thereof to provide a hermetically sealed enclosure. The header member comprises an insulating base portion 3 in which are embedded conductive leads 4, 5, and 6 and which is surrounded by a cylindrical conductive member 7 having a flange portion 8 adapted to engage flange portion 9 of the cap member 2.

An insulating platform 10 is provided as part of the header assembly. The platform may be of any suitable insulating material such as ceramic or glass and is provided with a plurality of holes 11, 12 and 13 extending therethrough from major face to major face of the platform registering with leads 4, 5, and 6, respectively, and, in addition, is provided with a centrally located slot 14 extending through the platform and having a width which is not critical and may be 20 mils wide. One major face of the platform is provided with a plurality of distinct metallized areas 15, 16 and 17 each of which adjoins a hole. In addition, area 15 is adjacent one major side of the slot 14 and area 17 is adjacent the other major side of the slot.

A bar of silicon semiconductor material 18 in which a transistor has been formed consisting of emitter, base and collector regions 19, 20 and 21, respectively, is provided. The transistor bar may be obtained from a slice of ingot of silicon in which the emitter base and collector regions are formed by a grown-diffusion process. In the latter process initially an N-type conductivity portion is grown in the ingot from a melt of silicon doped with an N-type of impurity, such as phosphorus. Next, elements, such as gallium and antimony, are added to the melt in predetermined proportions and another portion of the ingot is grown. The proportions of gallium and antimony are selected to produce N-type conductivity therein. The latter process is continued for a sufficient time to permit diffusion of impurities from the later grown portion into the initially grown N-type portion. In the latter process a thin P-type base region is formed as gallium diffuses considerably faster than either phosphorus or antimony and is present in sufficient quantity to predominate over the phosphorus in the initially grown portion of the ingot. Thus there is formed in the ingot two end portions which are of N-type conductivity and an intermediate region which is of P-type conductivity. The quantities of dopants or impurities are selected so that the initially grown N-type conductivity portion is of relatively high resistivity, for example, about 2.5 to 4.5 ohm cms., the intermediate P-type conductivity portion is of intermediate resistivity, and graded, for example, near the emitter-base junction having a resistivity of about 1 ohm cm., and the other N-type conductivity portion is of low resistivity for example about 0.8 of an ohm cm. The resistivity of the latter region is made higher than in conventional transistors to increase the breakdown voltage of the emitter base junction for reasons to be considered in more detail below in connection with the operation of the device.

The ingot is then sliced into a plurality of bars in each of which the low resistivity portion forms the emitter 19, the high resistivity portion forms the collector 21, and the intermediate resistivity portion forms the base 20 of the transistor 18. The bar is approximately 17 mils (a mil is one thousandth of an inch) in cross section and about 110 mils long and has a base width of approximately .15 mil.

The bar is etched and suitably washed then is spaced on the metallized areas 15 and 17 with the base of the transistor spaced within about 3 mils of the area 17, and then secured to the metallized areas by means of a suitable solder. The spacing of the collector-base junction is not critical and may conveniently be, as mentioned, 3 mils. The metallized areas may be of a suitable material to avoid the need for additional solder material, for example with an N-P-N transistor bar the metallized area may consist of an alloy of gold and antimony (for example, 99% gold and 1% antimony) insuring good ohmic contact between the ends of the bar to the metallized areas. The contact areas 15, 16 and 17 of the insulating platform 10 may be metallized by any of a variety of ways well known in the art, for example, with a ceramic platform the metallizing technique disclosed in U.S. Patent 2,667,427 could be used. The insulating member is securely held in place on the insulating base portion 3 by a solder bond between each of the leads and a respective metallized area.

A flexible wire-like electrode 22 having a diameter of about 3 mils of a P-type conductivity inducing material such as aluminum is provided. One end of the wire is fused to the base region of the N-P-N transistor bar on one side thereof by applying a voltage of sufficient magnitude for a sufficient time between the base lead and the emitter and collector leads to provide a good visual and mechanical ohmic bond to the base region. The other end of the wire is soldered to the metallized area 16.

The bar of silicon semiconductor material is next oxidized by an anodizing process. In this process deionized water is used as the electrolyte and a pair of platinum conductors are used as the anode and cathode electrodes. The base lead 5 is connected to the anode and the device is immersed in the electrolyte. A pulsating D.C. current is then applied between the anode and cathode electrodes of the resultant electrolytic cell. Sufficient voltage is applied between the electrodes to deliver a power of 2,000 watts to the cell. The voltage is applied cyclically with an "on" duration of 1/120 sec. and an off duration of 1/120 sec. The latter process is continued for 0.1–0.5 hour to form an oxide layer 23 or coating on exposed portions of the silicon bar. It is estimated that the silicon oxide formed under these conditions is approximately 700 Angstroms thick.

The cap member 2 includes in the top portion thereof molecular sieve 24, a buffer material 25 which may be a glass wool and a metallic retaining ring 26 pressed into the cap 2 to hold the buffer and sieve in the top of the cap. Molecular sieve procurable from Linde Air Products Company is a material similar to zeolites, and is composed of soda, lime, alumina, and silica. It has the property of taking on and releasing substances such as water vapor reversibly in response to changes in temperature thereof without alteration of its sieve-like structural form even at appreciably high temperatures. The molecular sieve normally performs the function of stabilizing the moisture content of the device. In the device in accordance with the present invention it serves as a reservoir of water and a hydrolizable organo-amino alkoxy silane used in the process for appropriately polymerizing the oxidized silicon bar. The glass wool buffer material is used to prevent the relatively fragile molecular sieve material from crumbling and damaging the surface of the active elements of the semiconductor device.

In accordance with the process for forming the semiconductor device of the present invention a small quantity of hydrolizable organo-amino alkoxy silane of either the monofunctional, difunctional, or trifunctional forms is injected into the glass wool and sieve, which has a certain amount of moisture content therein, for example, .0005 of a milliliter by volume or 1 milligram by weight of gamma amino-butyl methyl diethoxy silane. The cap member 2 is then secured as mentioned above in nitrogen atmosphere to the header member 1. The completed device is next heated to 230° C. for 7 days. The latter process causes vaporization of the above-mentioned material silane which then reacts with the anodically formed oxide to form thereon the positive polar polymer 27 including the positively polarized amine group joined to the silicon oxide by an oxide link. The water vapor released from the sieve during the process also enters into the polymerization. The resulting material formed is the organic starting material minus the alcohol radical from the alkoxy group of the silane. The by product of the reaction is ethyl alcohol $C_2H_5OH$ which is not detrimental to the operation of the device. It is estimated that the dielectric coating or layer may be of the order of 2000 to 3000 Angstroms thick. The assembled device thereafter is baked at 300° C. for four hours and is ready for operation. While the bar with just the thin anodically grown oxide thereon provides insufficient passivation, the addition of the polymer thereto provides a high degree of passivation. However, as the polymer is an integral part of the functional device in its charge supplying capacity, as will be explained in more detail below, complete enclosure is necessary for this reason. While the cap or enclosure provides environmental and mechanical protection for the elements of the device, it also enables the polymerization process to be simply and effectively performed.

While it has been mentioned that the silicon oxide is formed by an anodic process other processes may be used as well so long as the other processes do not involve temperatures in their formation deleterious to the transistor bar itself and the mounting thereof. The anodic process is performed at low temperatures involving a minimum of heat and accordingly is suitable for the formation of the desired silicon dioxide coating.

While a particular polymerizing procedure has been described it will be understood that other procedures may as well be used. When the polymerization process is performed on uncapped devices the polymer material forms on the flanges and leads of the device. Such formations are difficult to remove and require needless time, effort and cost.

A typical material useful in the process above is the gamma amino-butyl methyl diethoxy silane. It has the following graphic formula:

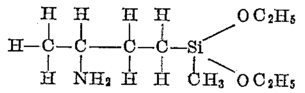

In the aforementioned heating step the alkoxyl groups of the silane combine with the OH groups which inherently exist on the anodically formed oxides to form an alcohol leaving the oxygen bonds of the silane linked to the silicon dioxide dielectric layer.

While in the typical formula a methyl group is included it is understood that ethyl or higher order groups can be included. While a butyl group is described the propyl and pentyl groups and higher order groups may as well be used. In addition, while the amino is shown in the gamma position it may be used in the alpha, beta or delta position, or in complete replacement of hydrogen atoms. However, the delta form is toxic; accordingly, it is desirable for this reason to avoid its use. Replacing each of the hydrogen elements with the amine group would make the resultant polymer more polar. While the primary amine has been utilized the secondary and tertiary amines may also be used. The functions of the amine is to provide positive polarization to the resultant polymer. With more amine groups available in the polymer the greater would be the polarization. Among the important criteria as to which form of the hydrolizable organo-amino silane is useable is that it have charge and heat stability. With hydrocarbon groups having long structural chains heat stability becomes a problem. Also, of course, the hydrolizable organo-amino silane should have the properties to produce the desired resultant device.

The field effect transistor device of the present invention depends for its operation on the formation of narrow negative channels from one N-type end region to the other. While it is not clearly understood why the channels are formed in the P-type base region permitting conduction from one N-type conductivity end region to the other N-type end region it is believed that the surface of the silicon oxide coating is positive in polarization and negative charges are induced by a capacitance effect on the surface adjacent region of the silicon bar. The magnitude of the induced negative charge depends upon the thickness of the silicon dioxide layer. The charge can be enhanced by increasing the positive charge adjacent the surface of the oxide. This can be accomplished by bonding to the surface a polarizing material such as the material mentioned above. The oxide and the positive polar polymer need be applied only adjacent the base region where its effect is needed, but application of the oxide and the dielectric material on all the exposed area of the silicon bar improves the stability of the device.

It is apparent that among other ways in which the channel can be varied is by varying the thickness of the oxide coating, the thickness of the polarizing material and by the particular hydrolizable amino alkoxy silane as well as by varying the dimensions and resistivity of the various regions of the bar as well as the mountings thereof. A particular advantage of the class of silanes utilized is that they produce a stable quantity and arrangement of charge on the internal interface of the resultant polymer. It will be appreciated that with suitably negatively polarized constituents in the silane that devices in accordance with the present invention with P-N-P starting material could be fabricated.

In a conventional transistor the emitter-base junction has a reverse breakdown voltage of about six volts. To make these devices suitable for operation with transistors which make use of collector voltages of higher magnitude it is necessary to increase the resistivity of the emitter region to raise the breakdown voltage of this junction.

In the operation of the device application of voltage between the leads 4 referred to as the cathode lead and 6 referred to as the anode lead through a load will produce a certain load current. As the voltage on the base lead 5 normally referred to as the gate lead is varied, the volume occupied by the induced charge in the P-type conductivity region varies. Thus a variation in the resistivity between anode and cathode leads, and hence variation of current in the load, is produced.

Figure 3:
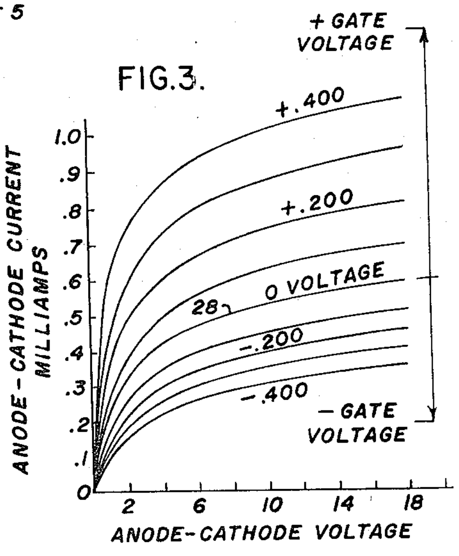
FIGURE 3 is a graph of the anode-cathode current versus the anode-cathode voltage of the field effect device of FIGURES 1 and 2 for various values of gate to cathode voltage of the device.

Referring now to FIGURE 3 there is shown a group of graphs of the variation of anode-cathode current plotted along the ordinate in response to anode-cathode voltage plotted along the abscissa for various values of gate to cathode voltage. Graph 28 represents the variation for a zero reference voltage applied between the gate lead and the cathode. The graphs above the graph 28 represent the variations of the anode-cathode current for positive increments of 100 millivolts of gate voltage from the predetermined reference voltage. The graphs below the reference graph 28 represent the variations of the anode-cathode current for negative increments of 100 millivolts of gate voltage from the predetermined reference voltage. These graphs are typical for the particular exemplary construction and process described in connection with the device of FIGURES 1 and 2. A particular advantage of the device of the present invention is that it can be operated at zero bias and hence does not require a bias source. Also, the device has the highest transconductance at zero bias voltage.

The device in accordance with the present invention is a device of excellent electrical stability and performance. With changes in design considerations suggested and indicated above the characteristics of the device can be designed to meet desired circuit requirements. In addition the device illustrated is very simple and inexpensively constructed and is capable of providing improved performance at lower cost than conventional devices. The typical device of FIGURES 1 and 2 may have input impedances of the order of 100 million ohms and output impedances of the order of 100 thousand ohms. Of interest in connection with this device is that at high gate voltage the device acts as a conventional transistor although not optimized for that type of operation.

Figure 4:
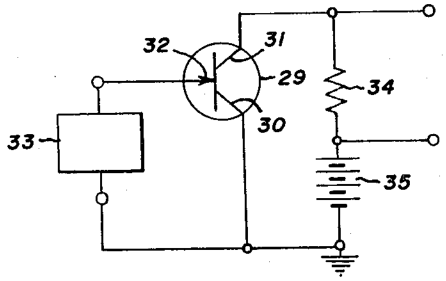
FIGURE 4 is a schematic diagram of a simple circuit showing a manner in which the field effect device of FIGURE 1 may be used.

Referring to FIGURE 4 there is shown a simplified schematic diagram of an amplifier circuit in which a field effect transistor device 29 may be used. Field effect transistor 29 has cathode 30, an anode 31, and a gate electrode 32. For the field effect transistor of FIGURE 1 and 2 a signal source 33 is connected between the cathode 30 and gate electrode 32. If desired, a small positive or series negative bias may be applied in series therewith. The signal source may be any of a variety of devices, for example, the output circuit of a transistor amplifier which has a relatively high output impedance compared to its input, or the output of such a device as a phonograph pickup element. The load 34 and positive bias source 35 are connected in series between the anode 31 and cathode 30 of the transistor 29. Variations in the potential between the gate 32 and cathode 30 causes corresponding variations in the current in load 34, thereby producing a change in the voltage appearing across the load 35. The load impedance 35 may be relatively low and therefore the output impedance as it appears across the load or across the anode 31 and the negative terminal of source 35, which may be connected to ground, is also low. Hence the output of the field effect transistor amplifier can be applied conveniently to the input of a conventional transistor without the need for transformers or other active circuit elements to effect an impedance conversion.

While a specific embodiment has been shown and described, it will, of course, be understood that various modifications may be devised by those skilled in the art which will employ the principles of the invention and found in the true spirit and scope thereof.

What I claim as new and desire to secure by Letters Patent of the United States is:

1. A semiconductor device comprising a body of silicon semiconductor material including a pair of regions of one conductivity type and a thin region of the opposite conductivity type spaced between said regions of one conductivity type and forming therewith a pair of P-N junctions, electrical connections to each of said regions, a silicon oxide layer on said body covering the active portions thereof, and a layer of a polar silane polymer having the same polarity as said opposite conductivity type region adhered to said oxide layer.

2. A semiconductor device comprising a body of silicon semiconductor material including a pair of regions of N-type conductivity and a thin region of P-type conductivity spaced between said regions of one conductivity type and forming therewith a pair of P-N junctions, electrical connections to each of said regions, a silicon oxide layer on said body covering the active portions thereof including at least said thin region and said junctions, and a layer of a positive polar amino silane polymer adhered to said oxide.

3. A semiconductor device comprising a body of silicon semiconductor material including a pair of regions of N-type conductivity and a thin region of P-type conductivity spaced between said regions of N-type conductivity and forming therewith a pair of P-N junctions, electrical connections to each of said regions, a thin silicon oxide layer covering said body having hydroxyl radicals bonded to the surface of said layer remote from said body, and a thin layer of a positive polar polymer adhered to said oxide layer, said polymer consisting of the reaction product of a hydrolizable organo-amino alkoxy silane with said hydroxyl radicals associated with said oxide layer.

4. A field effect transistor comprising a bar of silicon semiconductor material including a pair of regions of N-type conductivity and a thin region of P-type conductivity spaced between said regions and forming a pair of P-N junctions therewith, a silicon oxide layer on said bar, electrical connections to each of said regions, and a layer of a positive polar polymer adhered to said oxide layer by hydroxyl bonds on the surface of said oxide, said polymer comprising gamma amino butyl methyl diethoxy silane.

References Cited by the Examiner

UNITED STATES PATENTS

| | | | |
|---|---|---|---|
| 3,086,892 | 4/1963 | Huntington | 148—1.5 |
| 3,160,520 | 12/1964 | Jantsch | 117—201 |

JOHN W. HUCKERT, *Primary Examiner.*

M. EDLOW, *Assistant Examiner.*